United States Patent
Verhoeven et al.

(10) Patent No.: US 10,725,077 B2
(45) Date of Patent: Jul. 28, 2020

(54) TAMPER DETECTOR

(71) Applicant: NXP B.V., Eindhoven (NL)

(72) Inventors: Henri Verhoeven, Someren (NL); Joop Petrus Maria van Lammeren, Beuningen (NL); Oswald Moonen, Eindhoven (NL)

(73) Assignee: NXP B.V., Eindhoven (NL)

( * ) Notice: Subject to any disclaimer, the term of this patent is extended or adjusted under 35 U.S.C. 154(b) by 201 days.

(21) Appl. No.: 15/366,419

(22) Filed: Dec. 1, 2016

(65) Prior Publication Data

US 2018/0156854 A1 Jun. 7, 2018

(51) Int. Cl.
| | |
|---|---|
| G01R 27/28 | (2006.01) |
| G01N 27/02 | (2006.01) |
| G06K 19/077 | (2006.01) |
| G06K 19/07 | (2006.01) |

(52) U.S. Cl.
CPC ............ *G01R 27/28* (2013.01); *G01N 27/02* (2013.01); *G06K 19/0709* (2013.01); *G06K 19/0716* (2013.01); *G06K 19/0723* (2013.01); *G06K 19/07798* (2013.01)

(58) Field of Classification Search
None
See application file for complete search history.

(56) References Cited

U.S. PATENT DOCUMENTS

| | | |
|---|---|---|
| 4,262,284 A | 4/1981 | Stieff et al. |
| 4,711,368 A | 12/1987 | Simons |
| 4,764,952 A | 8/1988 | Feliu |
| 4,890,763 A | 1/1990 | Curiel |
| 5,117,222 A | 5/1992 | McCurdy et al. |
| 5,117,457 A | 5/1992 | Comerford et al. |
| 5,298,884 A | 3/1994 | Gilmore et al. |
| 5,323,150 A | 6/1994 | Tuttle |
| 5,406,630 A | 4/1995 | Piosenka et al. |
| 5,457,748 A | 10/1995 | Bergum et al. |
| 5,464,092 A | 11/1995 | Seeley |
| 5,523,740 A | 6/1996 | Burgmann |

(Continued)

FOREIGN PATENT DOCUMENTS

| | | |
|---|---|---|
| EP | 2876581 A1 | 5/2015 |
| WO | WO-93/16933 A1 | 9/1993 |

OTHER PUBLICATIONS

"Customized RFID Solutions Adding Value to Your Business", Schreiner Group, 8 pgs., retrieved from the internet at Dec. 7, 2016: http://www.schreiner-group.com/en/technologies/radio-frequenz-identification-rfidnfc . . . .

(Continued)

*Primary Examiner* — Nasima Monsur

(57) ABSTRACT

A tamper detection device includes a detection circuit, configured to be powered by a near-field-communication (NFC) signal and store a status of a detection element; wherein the detection circuit is configured to set the status to undisturbed in response to an undisturbed state of the detection element; wherein the detection circuit is configured to set the status to disturbed in response to a disturbed state of the detection element; and wherein the detection circuit is configured to electrically report the detection element status in response to a wireless query signal.

17 Claims, 12 Drawing Sheets

(56) References Cited

U.S. PATENT DOCUMENTS

| | | |
|---|---|---|
| 5,650,766 A | 7/1997 | Burgmann |
| 5,880,523 A | 3/1999 | Candelore |
| 5,949,059 A | 9/1999 | Rawson, Sr. et al. |
| 6,050,622 A | 4/2000 | Gustafson |
| 6,501,390 B1 | 12/2002 | Chainer et al. |
| 6,888,509 B2 | 5/2005 | Atherton |
| 7,034,689 B2 | 4/2006 | Teplitxky et al. |
| 7,410,103 B2 | 8/2008 | Nagel |
| 7,652,577 B1 | 1/2010 | Madhow et al. |
| 8,186,731 B1 | 5/2012 | Romero et al. |
| 8,336,085 B2 | 12/2012 | Thirumalai et al. |
| 8,383,163 B2 | 2/2013 | Wagner et al. |
| 8,852,561 B2 | 10/2014 | Wagner et al. |
| 9,578,763 B1 | 2/2017 | Wade |
| 9,741,231 B2 | 8/2017 | Brandi |
| 2001/0022552 A1 | 9/2001 | Maloney |
| 2002/0130776 A1 | 9/2002 | Houde |
| 2003/0011474 A1 | 1/2003 | Ng |
| 2004/0073807 A1 | 4/2004 | Youssef |
| 2005/0017845 A1 | 1/2005 | Shellans |
| 2005/0051624 A1* | 3/2005 | Kipp ................ B65D 51/24 235/385 |
| 2005/0231365 A1 | 10/2005 | Tester et al. |
| 2006/0145848 A1 | 7/2006 | Marsilio et al. |
| 2006/0195705 A1* | 8/2006 | Ehrensvard ........ B65D 5/4233 713/194 |
| 2007/0069875 A1* | 3/2007 | Doi .................. G06F 21/554 340/440 |
| 2007/0086257 A1 | 4/2007 | Bernier et al. |
| 2007/0266447 A1* | 11/2007 | Hollander .......... G06F 21/32 726/34 |
| 2008/0061153 A1 | 3/2008 | Hickle et al. |
| 2008/0169926 A1 | 7/2008 | Reep |
| 2008/0272912 A1 | 11/2008 | Ishida |
| 2009/0033497 A1 | 2/2009 | Wyatt, Jr. et al. |
| 2009/0060194 A1* | 3/2009 | Mackey ............. G06F 21/554 380/277 |
| 2009/0302111 A1 | 12/2009 | Woodard et al. |
| 2010/0289629 A1 | 11/2010 | Allmaras et al. |
| 2011/0043339 A1 | 2/2011 | McGregor |
| 2011/0169614 A1 | 7/2011 | Mingerink et al. |
| 2011/0234241 A1* | 9/2011 | Lewis .............. H01L 23/576 324/649 |
| 2012/0131673 A1 | 5/2012 | Caci |
| 2012/0218110 A1* | 8/2012 | Forster ............ G06K 19/07372 340/572.1 |
| 2013/0019114 A1 | 1/2013 | Sumida |
| 2013/0135104 A1 | 5/2013 | Nikkanen |
| 2013/0154613 A1 | 6/2013 | Bucsa et al. |
| 2014/0091781 A1 | 4/2014 | Cova et al. |
| 2014/0108786 A1* | 4/2014 | Kreft ................ G06F 21/71 713/156 |
| 2014/0235162 A1* | 8/2014 | Gallo .............. H04W 52/0229 455/41.1 |
| 2014/0263659 A1 | 9/2014 | Kervinen et al. |
| 2015/0002134 A1 | 1/2015 | Ramirez |
| 2015/0254961 A1 | 9/2015 | Brandi |
| 2016/0034899 A1 | 2/2016 | Myers et al. |
| 2016/0036588 A1 | 2/2016 | Thackston |
| 2016/0110725 A1 | 4/2016 | Bright |
| 2017/0219639 A1 | 8/2017 | Boudreau et al. |
| 2018/0129926 A1 | 5/2018 | Riedel et al. |
| 2018/0166398 A1 | 6/2018 | Campbell et al. |
| 2018/0182217 A1 | 6/2018 | Lamothe et al. |

OTHER PUBLICATIONS

"RFID tamper proof label Destructible NFC tag sticker", 8 pgs, retrieved from the internet Dec. 7, 2016 at: https://cxjrfid.en.alibaba.com/product/60552643352-2159-52082/RFID_tamper_proof_1 . . . .

GualaClsoures Group; "website—www.gualaclosures.com"; retrieved from the Internet; 4 page (Nov. 23, 2016).

Corelrfid Ltd.; retrieved from the internet http://www.rfidship.com/coretag-50x50mm-uhf-anti-tamper-label-2905-p.asp (Oct. 20, 2017).

Corelrfid Ltd.; retrieved from the internet http://www.rfidship.com/tamper-proof-label-mifare-lk-s50-or-ultralight-559-p.asp (Oct. 20, 2017).

"Tamper-Proof Label (NFC)"; retrieved from the internet http://www.rfidshop.com/tamper-proof-label-nfc-578-p.asp ; 8 pages (Dec. 7, 2016).

European Application No. 17156632.6 (not yet published) ;19 pages (Feb. 17, 2017).

Non Final Office Action for U.S. Appl. No. 15/898,424; 18 pages (dated Jul. 25, 2018).

Final Office Action, U.S. Appl. No. 15/898,424; 10 pages (dated May 8, 2019).

* cited by examiner

TAMPER DETECTOR

The present specification relates to systems, methods, apparatuses, devices, articles of manufacture and instructions for tamper detection.

SUMMARY

According to an example embodiment, a tamper detection device, comprising: detection circuit, configured to be powered by a near-field-communication (NFC) signal and store a status of a detection element; wherein the detection circuit is configured to set the status to undisturbed in response to an undisturbed state of the detection element; wherein the detection circuit is configured to set the status to disturbed in response to a disturbed state of the detection element; and wherein the detection circuit is configured to electrically report the detection element status in response to a wireless query signal.

In another example embodiment, the detection circuit is configured to continue to operate and electrically report the detection element status even after the detection element has been placed in the disturbed state.

In another example embodiment, further comprising an antenna coupled to the detection circuit; and wherein the antenna and the detection circuit are configured to continue to interoperate even after the detection element is disturbed.

In another example embodiment, the detection circuit is configured so that, once the status is set to disturbed, the status cannot afterwards be reset to undisturbed.

In another example embodiment, the detection circuit includes a reference oscillator and a detection oscillator; the detection circuit is configured to count a number of detection oscillator clock cycles and compare to a number of reference oscillator clock cycles; and the detection circuit sets the detection element status to the disturbed status if the count of the number of detection oscillator clock cycles is above or below a predetermined tolerance range.

In another example embodiment, the detection circuit includes a reference oscillator and a detection oscillator; and the detection circuit is configured to compare the reference oscillator's and the detection oscillator's frequencies, and set the detection element status to the disturbed status if the frequencies differ by more than a predetermined tolerance range.

In another example embodiment, a frequency of the reference oscillator is less than the frequency of the detection oscillator.

In another example embodiment, the detection oscillator is coupled to the detection element; and the detection circuit is configured to set the frequency of the detection oscillator based on an energy storage property of the detection element.

In another example embodiment, the detection circuit is configured to set the frequency of the detection oscillator based on either an inductance or a capacitance of the detection element.

In another example embodiment, the detection oscillator includes a ring oscillator circuit; and the detection circuit is configured to set the frequency of the detection oscillator based on a delay characteristic of the detection element.

In another example embodiment, the detection circuit is configured to set to the disturbed status in response to a change in either an inductance or a capacitance of the detection element.

In another example embodiment, either the inductance or the capacitance is distributed over the detection element.

In another example embodiment, the detection circuit set to the disturbed status in response to a change in a distributed resistance of the detection element.

In another example embodiment, the detection element includes at least one of a discrete: inductance, capacitance, diode, or resistance.

In another example embodiment, the tamper detection device is coupled to a package; and the package is at least one of: a bottle, a box, a bag, a pharmaceutical, a single-use device, an electronic device, an entry device, a security device, a stamp, an envelope, an electronic seal, a gas meter, a water meter, an electrical meter, as a seal of trucks, or a suitcase.

In another example embodiment, the detection circuit set to the disturbed status in response to at least one of: a breach, a tear, a displacement, a repair, or an electrical variation that exceeds a predetermined tolerance, in the detection element.

In another example embodiment, further comprising a plurality of detection elements; wherein the detection circuit is configured to report a number of detection elements having the disturbed status.

In another example embodiment, the detection circuit is configured to rank the detection elements having the disturbed status in terms of importance.

In another example embodiment, the detection circuit includes a comparator circuit; the comparator circuit is configured to sample a voltage drop over the detection element during a defined time window; and the comparator circuit sets the detection element status to the disturbed status if the voltage drop is above or below a predetermined tolerance range.

In another example embodiment, the detection element includes at least one of: a distributed resistance, a discrete resistance or a diode.

According to an example embodiment, a method for tamper detection, comprising: powering a detection circuit with a near-field-communication (NFC) signal; setting a status of a detection element to undisturbed in response to an undisturbed state of the detection element; setting the status of a detection element to disturbed in response to a disturbed state of the detection element; and reporting the detection element status in response to a wireless query signal.

In another example embodiment, setting the status of a detection element to the disturbed status in response to a change in either an inductance or a capacitance of the detection element.

In another example embodiment, setting the status of a detection element to the disturbed status in response to a change in a delay characteristic of the detection element.

The above discussion is not intended to represent every example embodiment or every implementation within the scope of the current or future Claim sets. The Figures and Detailed Description that follow also exemplify various example embodiments.

Various example embodiments may be more completely understood in consideration of the following Detailed Description in connection with the accompanying Drawings, in which:

Figure 1:
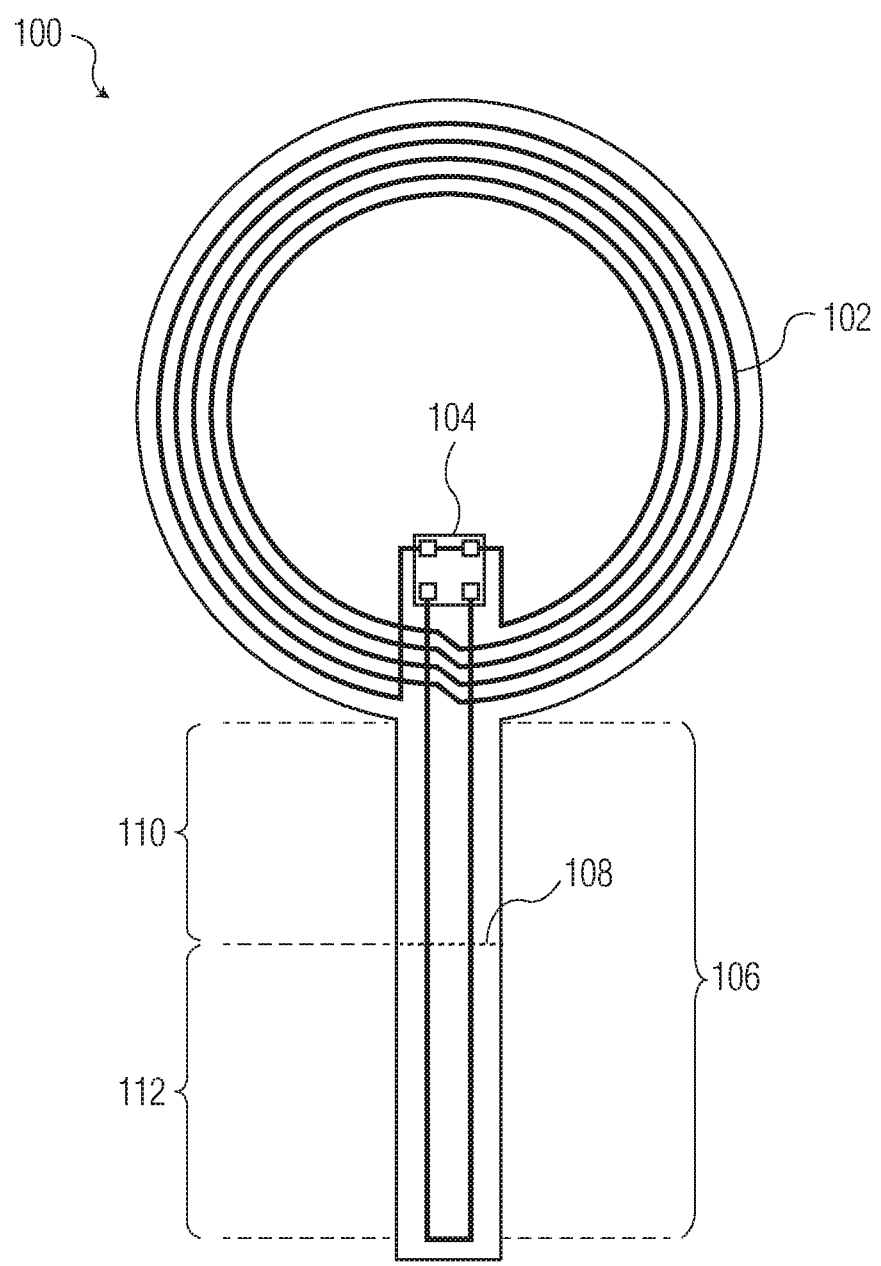
FIG. 1 is an example of a first tamper detection device in an undisturbed state.

While the disclosure is amenable to various modifications and alternative forms, specifics thereof have been shown by way of example in the drawings and will be described in detail. It should be understood, however, that other embodiments, beyond the particular embodiments described, are possible as well. All modifications, equivalents, and alternative embodiments falling within the spirit and scope of the appended claims are covered as well.

DETAILED DESCRIPTION

A tamper detection device including a detection element in combination with a detection circuit, perhaps including an NFC chip, for detecting package tampering is now discussed. The detection element can be discrete, distributed or a combination of both. In one example embodiment, the device detects LC behavior variations of a detection element inductance (L) in combination with a capacitance (C) embedded in the detection circuit. Opening, reclosing, replacing and/or manipulating the detection element is detectable using the tamper detection device. In one example, the tamper detection device will check for tampering at each start up, perhaps in response to a tap from a smartphone.

Figure 2:
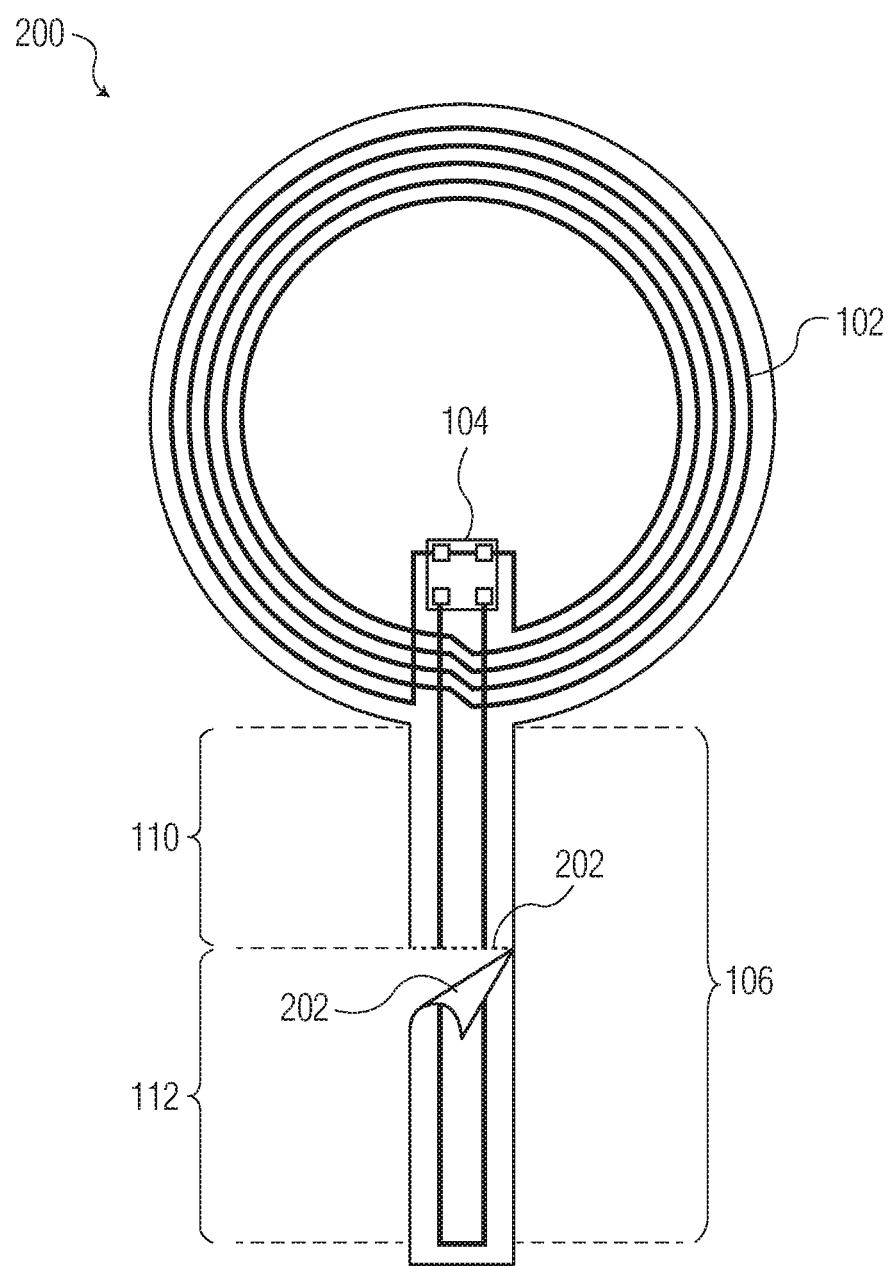
FIG. 2 is an example of the first tamper detection device in a disturbed state.

FIG. 1 is an example of a first tamper detection device 100 in an undisturbed state. The first tamper detection device 100 includes an antenna 102, a detection circuit 104, and a detection element 106 (e.g. wire, distributed L, C or R, discrete L, C or R). The detection element 106 includes an undisturbed breach element 108 (e.g. pull linkage, shear element, tear strip, etc.), a top portion 110, and a bottom portion 112. FIG. 2 is an example of the first tamper detection device 100 in a disturbed state. A disturbed breach element 202 is shown. FIGS. 1 and 2 are now discussed together.

The detection circuit 104 in one example embodiment is configured to be powered by a near-field-communication (NFC) signal and store a status of a detection element 106. The detection circuit 104 is configured to set the status to undisturbed in response to an undisturbed state of the detection element 106. The detection circuit 104 is configured to set the status to disturbed in response to a disturbed state of the detection element 106. The undisturbed state in some example embodiments is defined as a state opposite to the disturbed state.

The detection circuit 104 in one example, is included in an NXP Semiconductors NTAG TAG 21x family chip (NFC Type 2 tag compliant). The antenna 102 is connected to a set of antenna pads on the detection circuit 104 (e.g. IC, chip, etc.) and the NTAG tamper detection element 106 is connected to a set of tamper pads on the detection circuit 104.

Then the detection circuit 104 is configured to electrically report the detection element 106 status in response to a wireless query signal. Thus, in one example embodiment the detection circuit 104 is configured to continue to operate and electrically report the detection element 106 status even after the detection element 106 has been placed in the disturbed state. Continued operation is possible since the antenna 102 remains coupled to the detection circuit 104 and are configured to continue to interoperate even after the detection element 106 is disturbed.

The detection circuit 104 is configured to set to the disturbed status in response to a change in either an inductance or a capacitance of the detection element 106. The inductance or the capacitance can either be distributed over the detection element 106 or a discrete part of the detection element 106.

In an alternate embodiment, the detection circuit 104 is set to the disturbed status in response to a change in a distributed resistance of the detection element 106.

The tamper detection device 100 can be coupled to a package to detect tampering. The package in various example embodiments can be: a bottle, a box, a bag, a pharmaceutical, a single-use device, an electronic device, an entry device, a security device, a stamp, an envelope, an electronic seal.

The detection circuit 104 is configured to interpret changes in either the inductance or the capacitance of the detection element 106 and set to the disturbed status in response to at least one of: a breach, a tear, a displacement, a repair, or an electrical variation that exceeds a predetermined tolerance, in the detection element 106.

Some example embodiments of the tamper detection device 100 include a plurality of detection elements 106. The detection circuit 104 could then be configured to report a number of detection elements 106 having the disturbed status and perhaps rank the importance of each disturbed detection elements 106. Some detection elements 106 may be more important to the integrity of the package's contents. Customized responses to such specific subsets of detection elements 106 disturbed could then be crafted.

Figure 3:
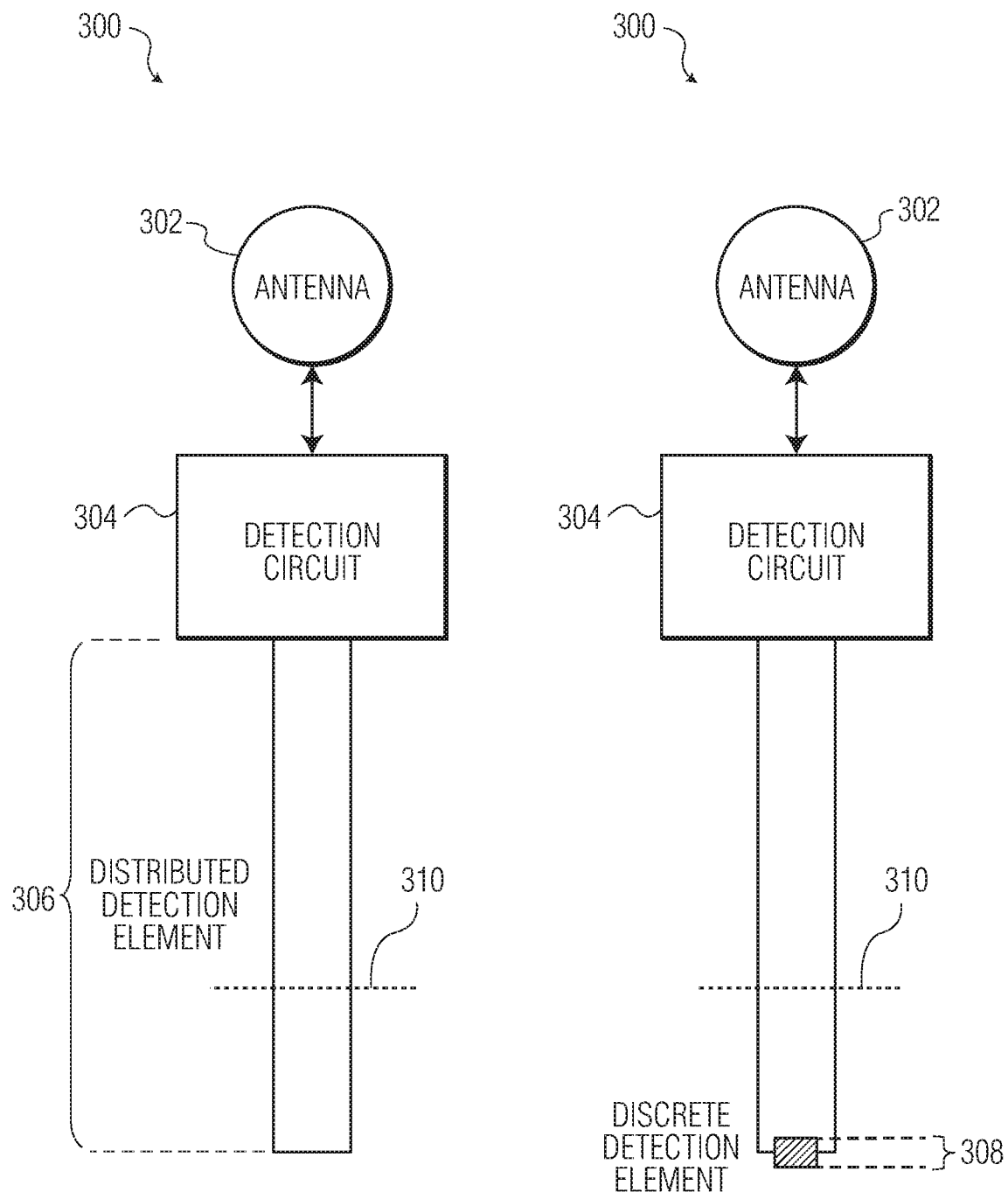
FIG. 3A is an example of a second tamper detection device having a distributed detection element.
FIG. 3B is an example of the second tamper detection device having a discrete detection element.

FIG. 3A is an example of a second tamper detection device 300 having a distributed detection element 306. The second tamper detection device 300 includes an antenna 302, a detection circuit 304, the distributed detection element 306, and a breach element 310. Here the distributed detection element 306 can be at least one of: a detection wire having a distributed inductance, capacitance, or resistance.

FIG. 3B is an example of the second tamper detection device 300 having a discrete detection element 308. Here the discrete detection element 308 can be at least one of: a discrete inductance, capacitance, diode, or resistance coupled to the detection wire. For such discrete embodiments, the detection element 308 is on one side of the breach element 310 (e.g. pull linkage, shear element, tear strip, etc.), and the detection circuit 304 is on the other side of the breach element 310.

In some example embodiments, the resistance or diode in the discrete detection element 308 is a bare chip which is connected with two bond wires.

Figure 4:
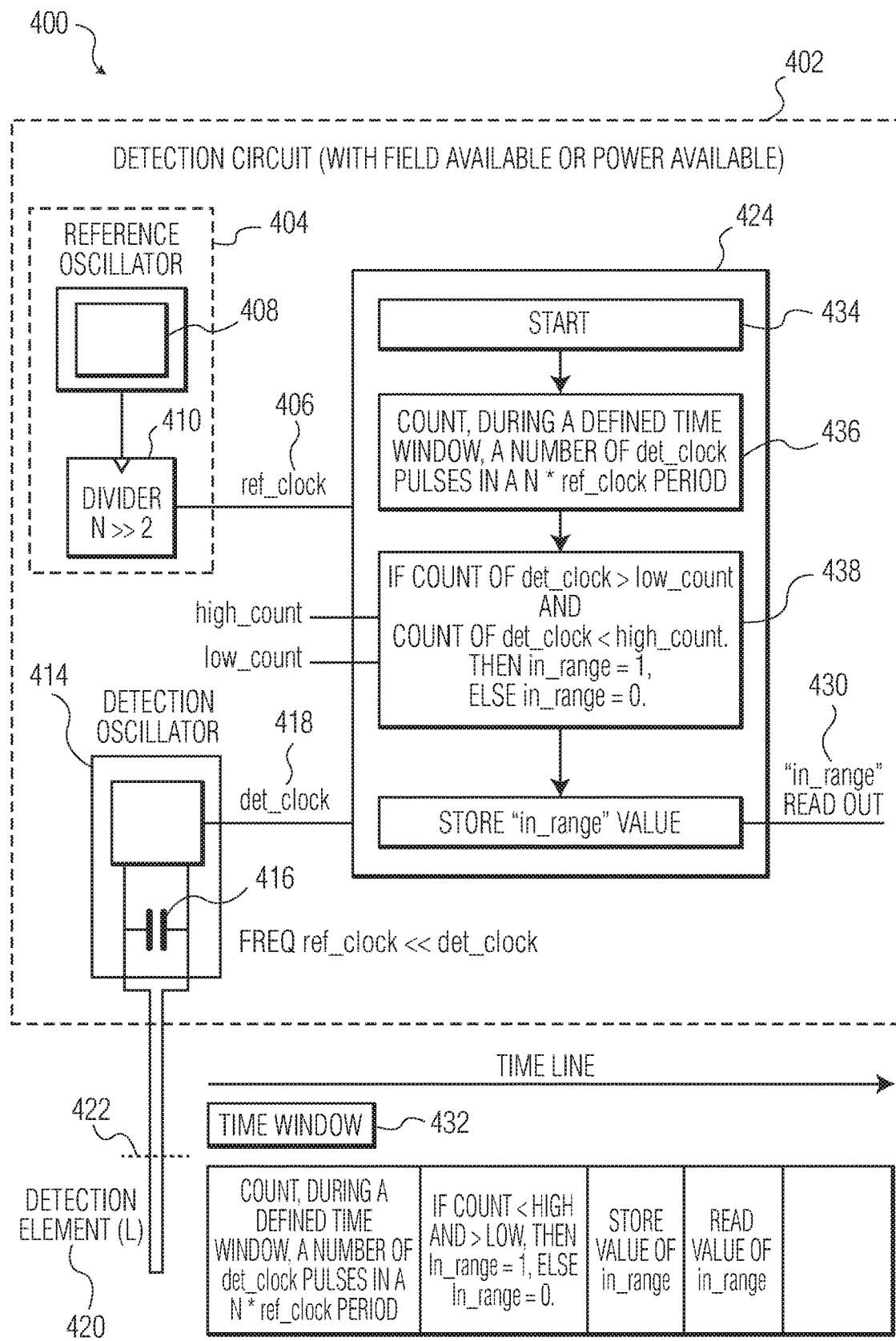
FIG. 4 is an example of a third tamper detection device having a first reference oscillator.

FIG. 4 is an example of a third tamper detection device 400 having a first reference oscillator 404. The third tamper detection device 400 includes a detection circuit 402, the first reference oscillator 404, a detection oscillator 414, a comparator circuit 424 that generates an in_range signal/value, and an in_range read out 430.

The first reference oscillator 404, includes a resonant circuit 408 and a divider 410, and generates a ref_clock signal 406. The detection oscillator 414 includes an energy storage element 416 (e.g. capacitance) and generates a det_clock signal 418. The divider 410 is included since the det_clock (e.g. LC_clock) 418 signal frequency is much greater than the ref clock 406 frequency.

The detection oscillator 414 is coupled to the detection element 420 (e.g. distributed inductance) having a breach element 422.

The detection circuit 402 in this example is configured to compare the reference oscillator's 404 and the detection oscillator's 414 frequencies, and set the detection element 420 status to the disturbed status (i.e. in_range=0), if the frequencies differ by more than a predetermined tolerance. An alternate paradigm is to count and compare the ref_clock signal 406 and the det_clock signal 418 and set the detection element 420 status to the disturbed status if the clock counts differ by more than a predetermined tolerance.

The detection oscillator's 414 frequency is set based on the inductive and capacitive energy storage properties of the energy storage element 416 and the detection element 420.

While the detection circuit's 402 comparison route can be implemented in a variety of ways, an example implementation is now discussed.

When the third tamper detection device 400 is powered by an active NFC field, the comparator circuit 424 is triggered to start 434 counting a number of LC clocks cycles within a time window 432 (i.e. determine the detection oscillator's 414 frequency). In some example embodiments, however, the reference clock (ref_clock) signal 406 first is synchronized with the detection clock (det_clock/LC_clock) 418 and before counting is started 434.

The comparator circuit 424 then counts 436, during the defined time window 432, a number of det_clock pulses in a N*ref_clock period, where N is an integer. The LC circuit 416/422 causes the detection element's 420 LC tank circuit to oscillate at a first frequency when undisturbed and a second frequency when disturbed.

In 438, if the count 436 of det_clock > (i.e. is greater than) a low_count preconfigured threshold and <(i.e. less than) high_count preconfigured threshold, then in_range=1 (i.e. detection element 420 has not been disturbed). Otherwise, in_range=0 (i.e. detection element 420 has been disturbed/tampered with). Here the detection oscillator's 414 frequency is compared with the reference oscillator's 404 frequency. The ranges low_count and high_count can be programmed and are shown as inputs to the comparator circuit 424.

The in_range read out 430 is read by another device (e.g. a smartphone via a wireless connection) during a defined timeslot. The third tamper detection device 400, in some example embodiments, is only operational during a minimum function timeslot.

In one example embodiment, the detection circuit 402 is configured so that, once the status is set to disturbed, the status cannot afterwards be reset to undisturbed. Thus using the third tamper detection device 400, manipulations of the detection element 420, such as opening, reclosing, and/or replacing are detectable.

In one example embodiment of the tamper detection device, using an LC oscillator, the detection element 420 is a wire in the range of 3.5 cm long and 0.5 cm wide, and has an inductance (L) and a capacitor (C) having a value small enough to be embedded in a CMOS device.

Figure 5:
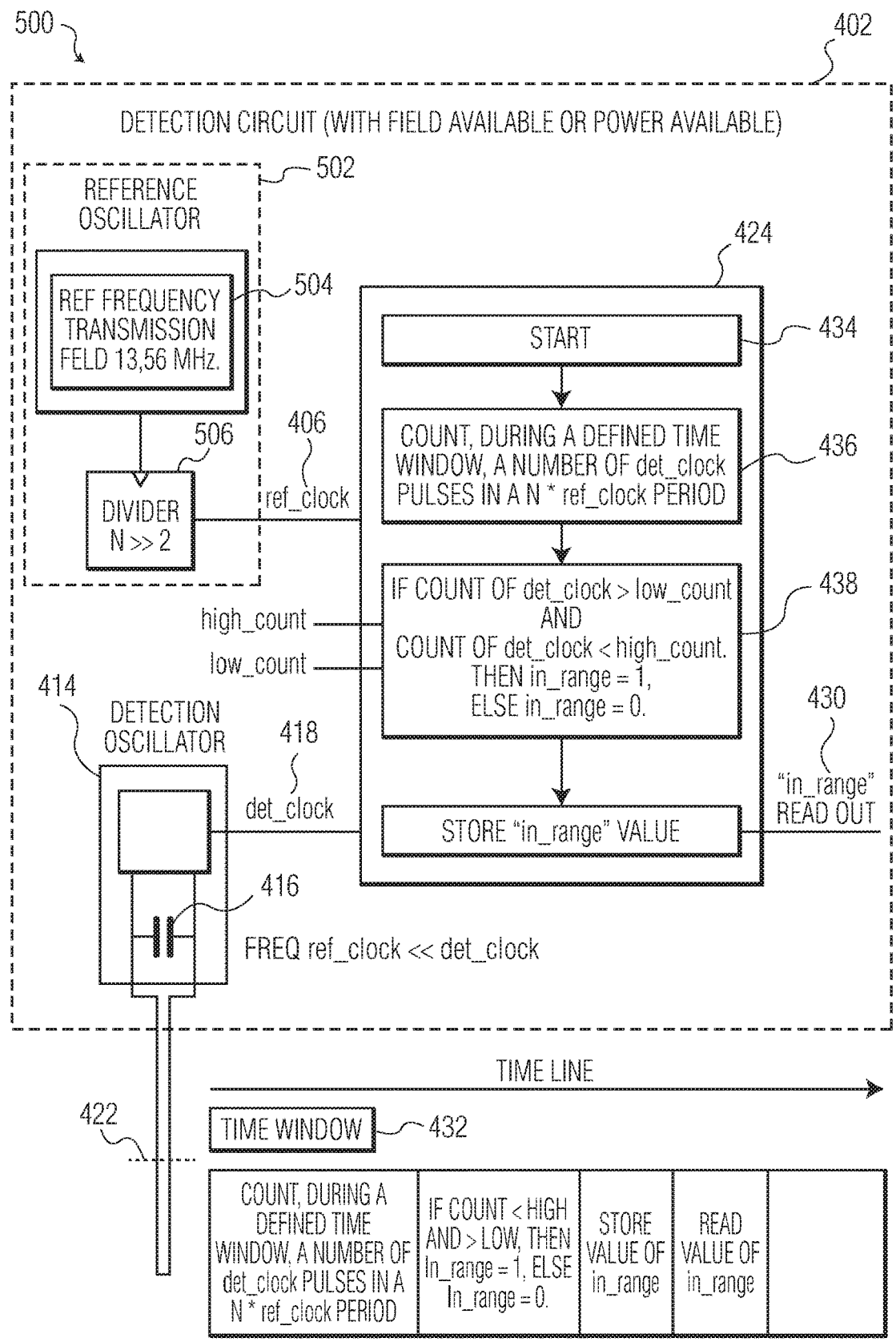
FIG. 5 is an example of the third tamper detection device having a second reference oscillator.

FIG. 5 is an example of the third tamper detection 400 device having a second reference oscillator 502. The operation of this example embodiment is substantially similar to that discussed in FIG. 4, except in this example the first reference oscillator 404 is replaced by a second reference oscillator 502 having an NFC signal derived reference frequency circuit 504 and a divider 506.

The NFC signal derived reference frequency circuit 504 is based on the 13.56 MHz. of the NFC transmission field. The ref_clock 406 is a divided value of ref frequency of the transmission field 504.

Figure 6A:
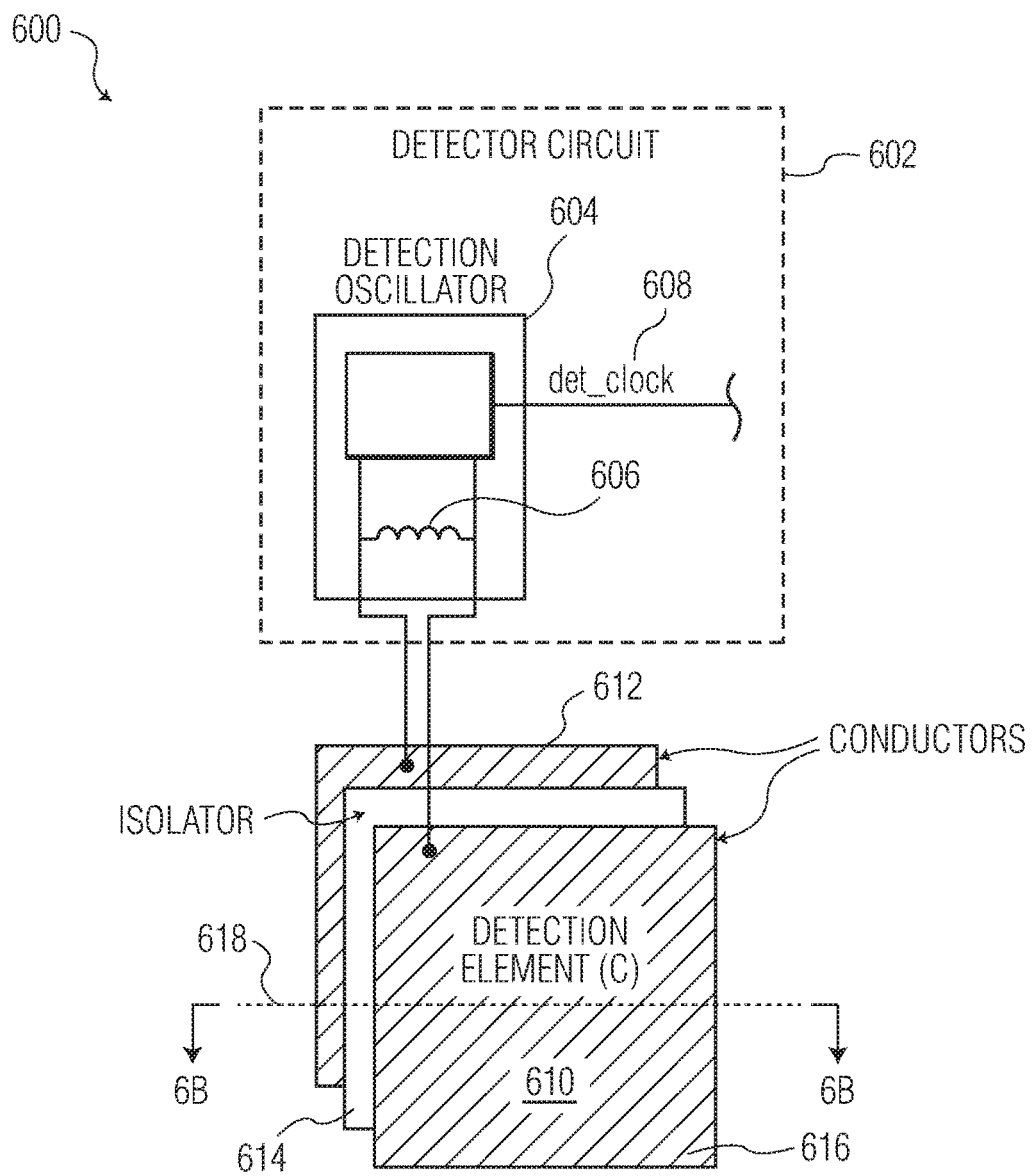
FIG. 6 is an example of a fourth tamper detection device.
Figure 6B:
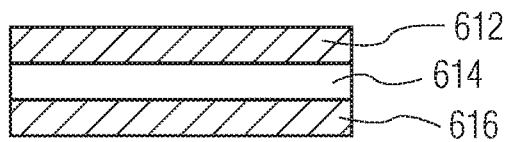

FIG. 6 is an example of a fourth tamper detection device 600. The fourth tamper detection device 600 detection circuit 602 is based on the third tamper detection device 400 detection circuit 402, but with modifications as shown in FIG. 6.

The modifications include a detection oscillator 604 has an energy storage element 606 (i.e. inductance) and generating a det_clock signal 608. Also a detection element 610 (e.g. distributed capacitance) includes a first conductor 612, an isolator 614, a second conductor 616, and an undisturbed breach element 618. In this example the detection element 610 is a capacitance distributed between the two conductors 612, 616 on either side of the isolator 614, and can have any shape or size. One example of a cross-section of the detection element 610 is also shown.

The detection element 610 in one embodiment could be wrapped around a package, such as a bottle and bottle cap.

Figure 7A:
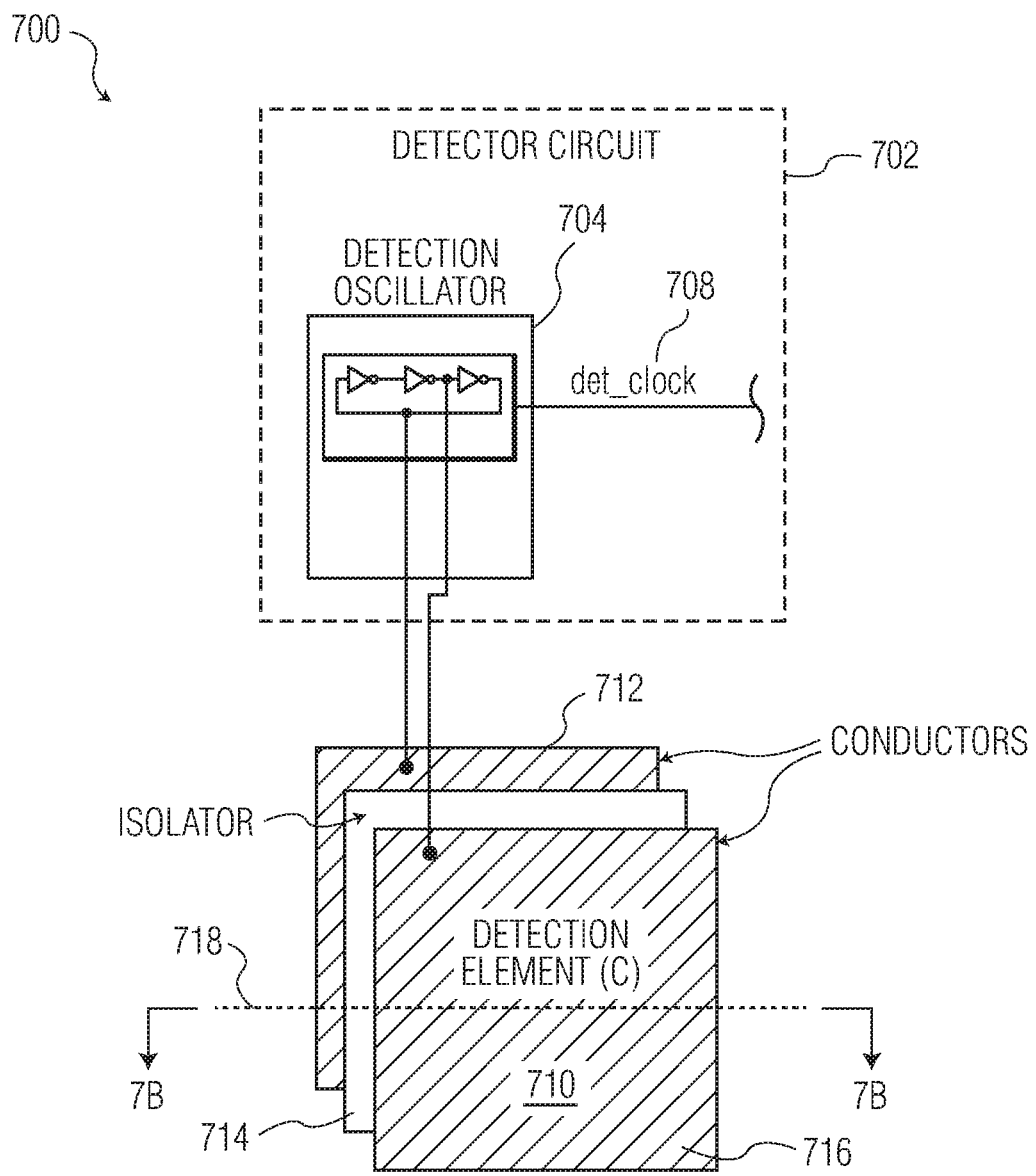
FIG. 7 is an example of a fifth tamper detection device.
Figure 7B:
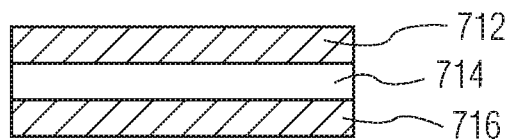

FIG. 7 is an example of a fifth tamper detection device 700. The fifth tamper detection device 700 includes a detection circuit 702, a detection oscillator 704 (i.e. a ring oscillator) that generates a det_clock signal 708, and a detection element 710 (e.g. delay element in the form of a distributed capacitance).

The detection element 710 includes a first conductor 712, an isolator 714, a second conductor 716, and an undisturbed breach element 718.

In this example, the detection oscillator 704 is a ring oscillator circuit, and the detection circuit 702 is configured to set the frequency of the detection oscillator 704 based on a delay characteristic of the detection element 710.

Figure 8A:
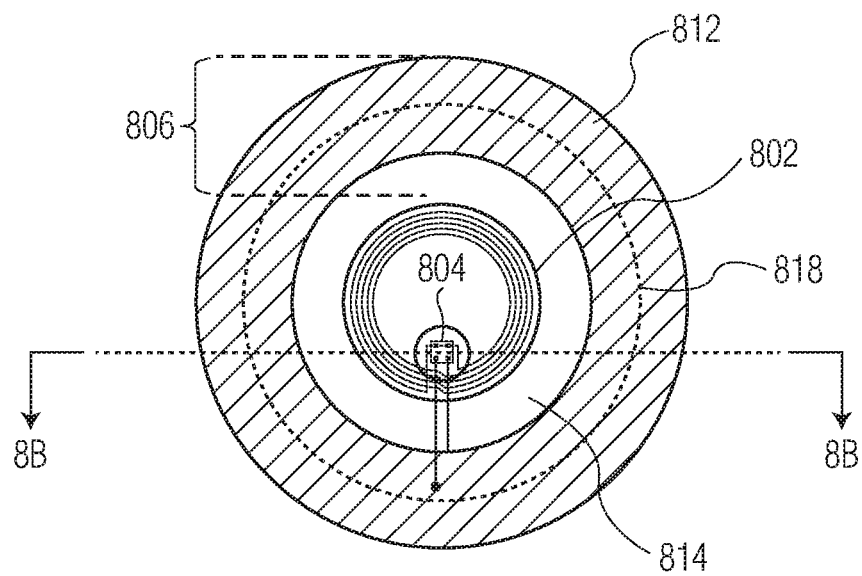
FIG. 8 is an example of a sixth tamper detection device.
Figure 8B:
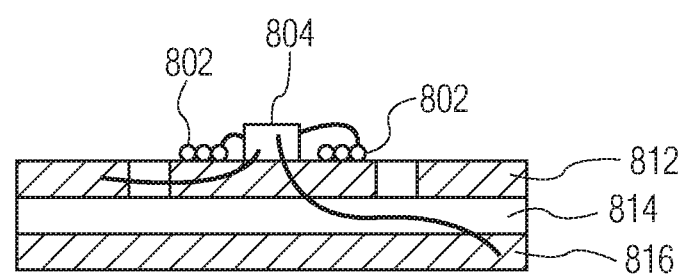

FIG. 8 is an example of a sixth tamper detection device 800. The sixth tamper detection device 800 includes an antenna 802, a detection circuit 804 and a detection element 806. The detection element 806 is a distributed capacitance, in the form of a first conductor 812, an isolator 814, a second conductor 816. The detection element 806 also includes an undisturbed breach element 818. In some example embodiments the tamper detection device 800 could additionally have a sticky surface to adhere to another package requiring tamper detection.

Figure 9:
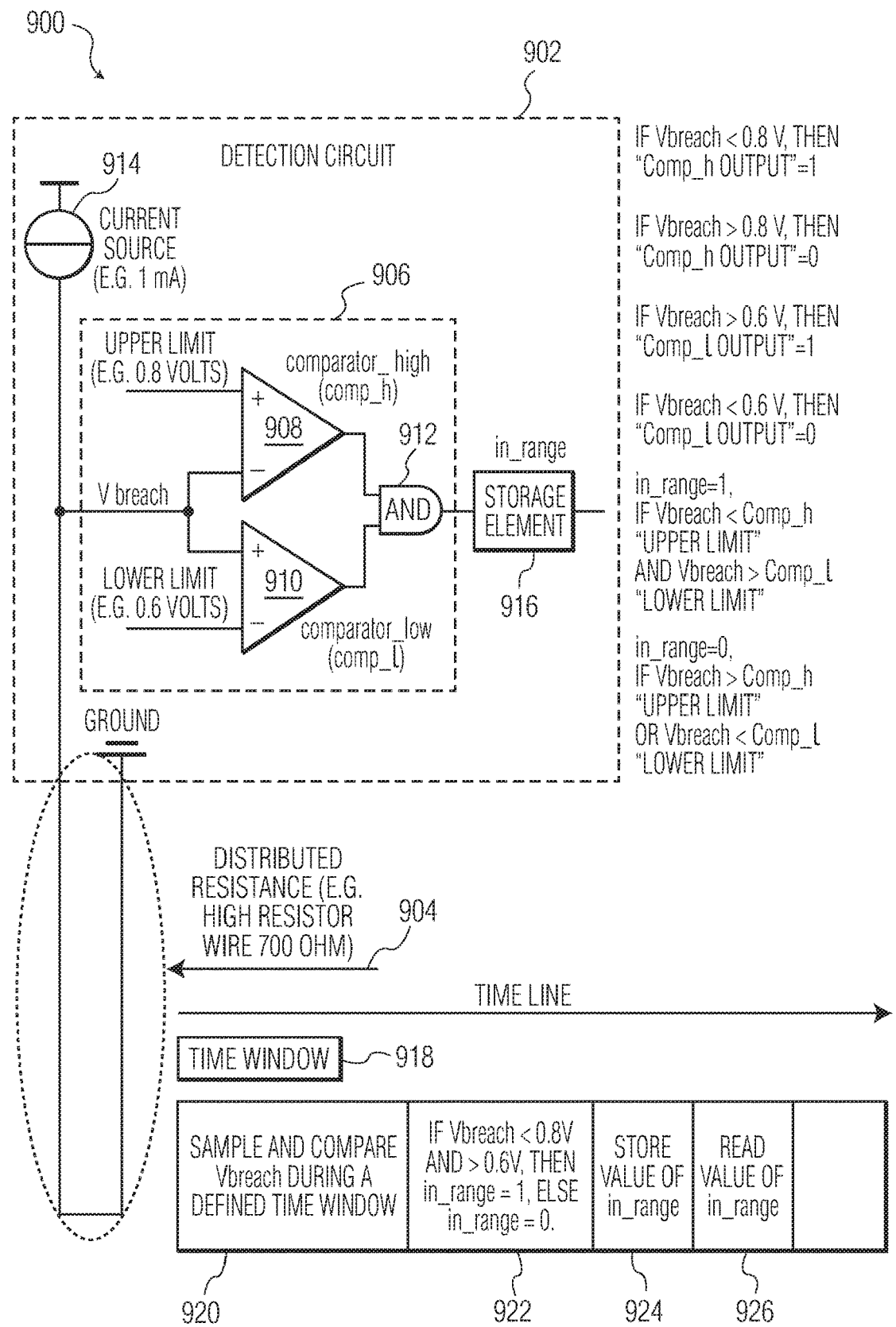
FIG. 9 is an example of a seventh tamper detection device having a distributed resistance detection element.

FIG. 9 is an example of a seventh tamper detection device 900 having a distributed resistance detection element 904. The seventh tamper detection device 900 includes a detection circuit 902 and the distributed resistance detection element 904. The detection circuit 902 includes a comparator circuit 906, a current source 914 and a storage element 916.

The comparator circuit 906 includes a first comparator 908 (e.g. comp_h), a second comparator 910 (e.g. comp_1), and an AND gate 912. The comparator circuit 906 also includes additional logic, etc. for executing the following sampling and storage routine.

The continuous measurement and storage routine includes, sample and compare 920 during the time window 918, a voltage drop (i.e. Vbreach) over the detection element 904 during a predefined time window 918.

Note:
if Vbreach <0.8 V, then "Comp_h output"=1 if Vbreach >0.8 V, then "Comp_h output"=0
if Vbreach >0.6 V, then "Comp_1 output"=1
if Vbreach <0.6 V, then "Comp_1 output"=0

Next 922, in this example embodiment: if Vbreach<Comp_h "upper limit" and Vbreach>Comp_1 "lower limit" then set in_range=1, and if Vbreach>Comp_h "upper limit" or Vbreach<Comp_1 "lower limit" then set in_range=0.

Then 924, the value of in range is stored in the storage element 916, and can be read out 926 in response to a query signal.

Figure 10:
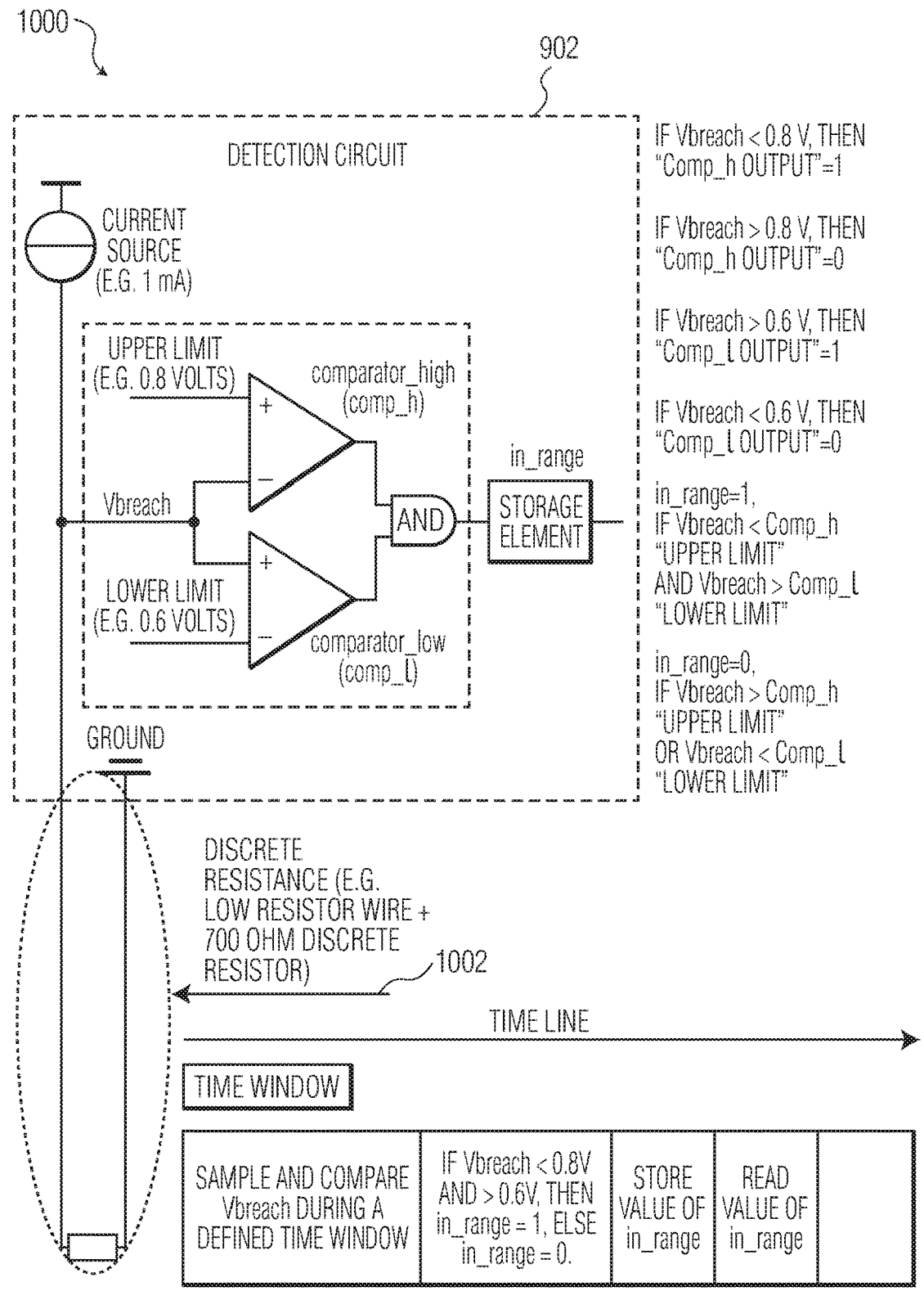
FIG. 10 is an example of the seventh tamper detection device having a discrete resistance detection element.

FIG. 10 is an example 1000 of the seventh tamper detection device 900 having a discrete resistance detection element 1002. The operation of this example embodiment is substantially similar to that discussed in FIG. 9, except in this example the detection element is the discrete resistance detection element 1002.

Figure 11:
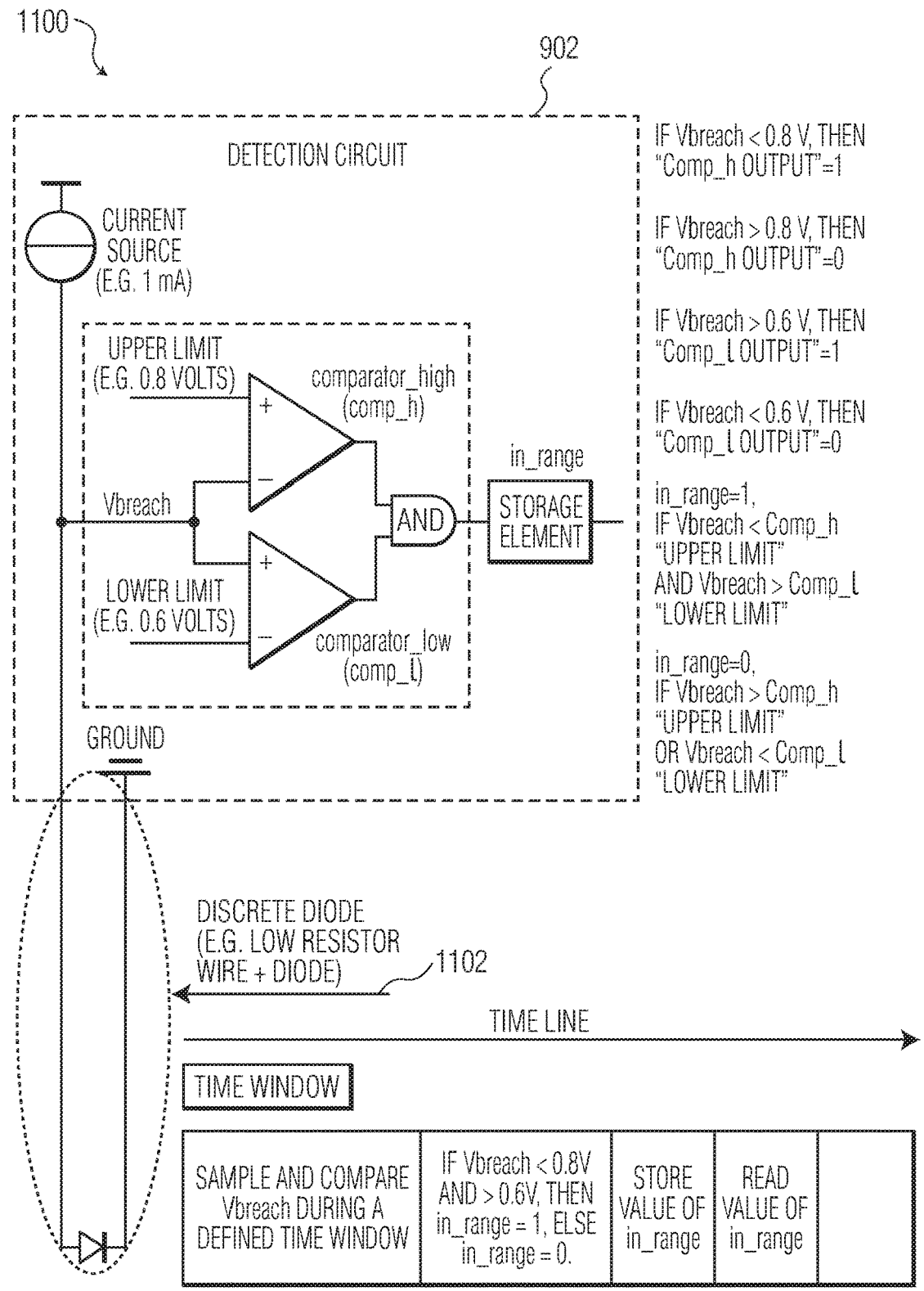
FIG. 11 is an example of the seventh tamper detection device having a discrete diode detection element.

FIG. 11 is an example 1100 of the seventh tamper detection device having a discrete diode detection element 1102. The operation of this example embodiment is also substantially similar to that discussed in FIG. 9, except in this example the detection element is the discrete diode detection element 1102.

Figure 12:
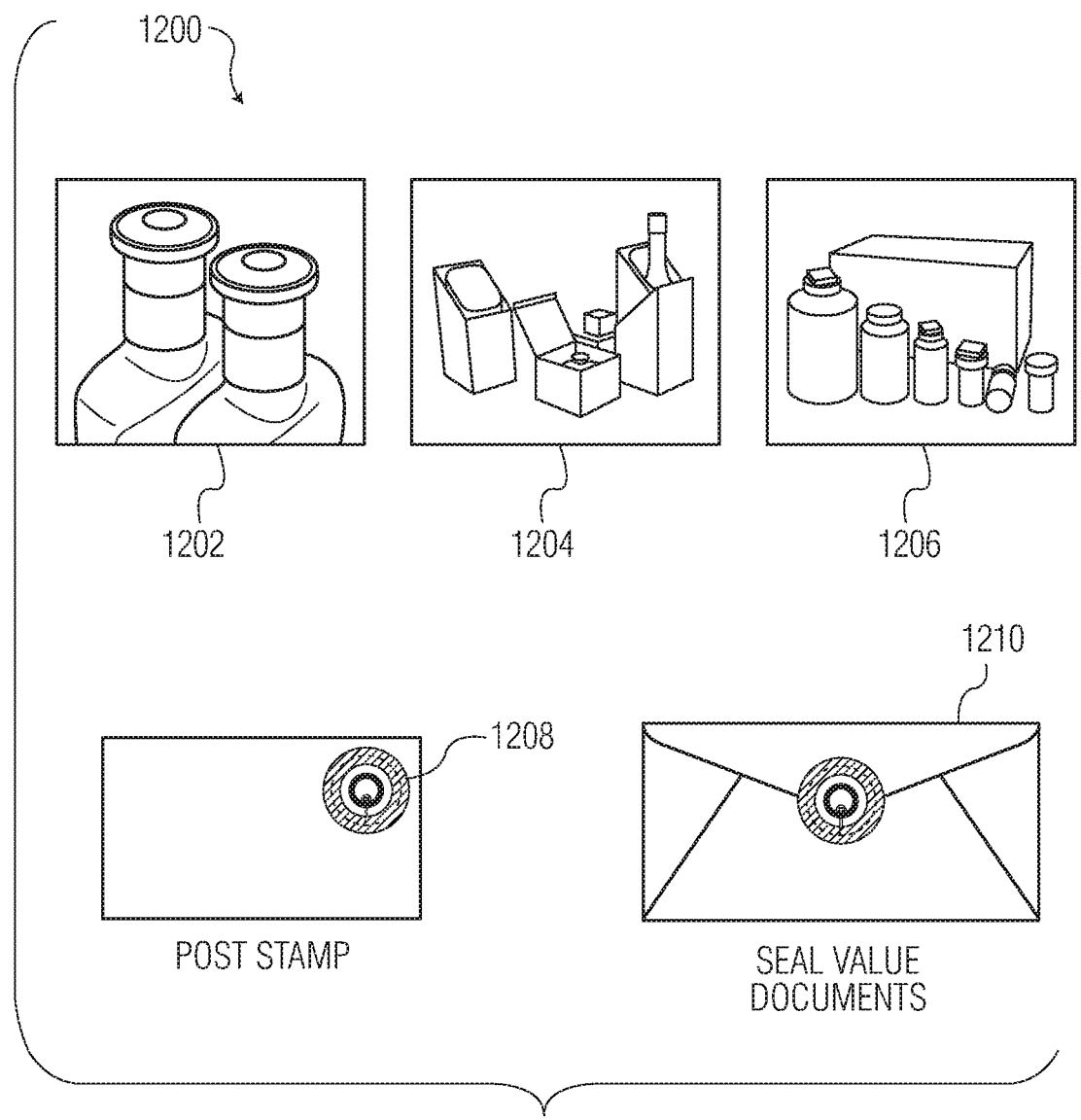
FIG. 12 is an example set of tamper detection device applications.

FIG. 12 is an example set of tamper detection device applications 1200. Shown are how tamper detection devices could be applied to bottles 1202, boxes 1204, pharmaceuticals 1206, stamps 1208 and envelopes 1210. Additionally tamper detection devices could be added to gas meters, water meters, electrical meters, as a seal of trucks, on suitcases, and so on.

Thus one or more tamper detection devices in various examples can be used to protect: closures for spirits and wines, packaging for high value goods (e.g. beauty care products), packaging for highly counterfeited products, and/or packaging for Pharmaceuticals.

In this specification, example embodiments have been presented in terms of a selected set of details. However, a person of ordinary skill in the art would understand that many other example embodiments may be practiced which include a different selected set of these details. It is intended that the following claims cover all possible example embodiments.

What is claimed is:

1. A tamper detection device, comprising:
a detection circuit, wherein the detection circuit further comprises:
a reference oscillator, and
a detection oscillator having an inductance (L) in combination with a capacitance (C) embedded in the detection circuit, and
a detection element comprising a conductor on an opposite side from the detection circuit, wherein the detection circuit is configured to
count a number of detection oscillator clock cycles,
compare the counted number of detection oscillator clock cycles to a number of reference oscillator clock cycles,
set a detection element status to an undisturbed status after the counted number of detection oscillator clock cycles is within a predetermined tolerance range, wherein the predetermined tolerance range is defined between a low count threshold and a high count threshold,
set the detection element status to a disturbed status after the counted number of detection oscillator clock cycles is either above the high count threshold or below the low count threshold,
powered by a near-field-communication (NFC) signal,
store the detection element status, and
electrically report the detection element status in response to a wireless query signal.

2. The device of claim 1, wherein the detection circuit is configured to continue to operate and electrically report the detection element status even after the detection element is in the disturbed state.

3. The device of claim 1, further comprising:
an antenna coupled to the detection circuit, wherein the antenna and the detection circuit are configured to continue to interoperate even after the detection element is disturbed.

4. The device of claim 1, wherein the detection circuit is configured so that, once the detection element status is set to disturbed, the detection element status cannot afterwards be reset to undisturbed.

5. The device of claim 1, wherein the frequency of the reference oscillator is less than the frequency of the detection oscillator.

6. The device of claim 1, wherein the detection oscillator is coupled to the detection element and the detection circuit is configured to set the frequency of the detection oscillator based on an energy storage property of the detection element.

7. The device of claim 1, wherein the detection circuit is configured to set the frequency of the detection oscillator based on either an inductance or a capacitance of the detection element.

8. The device of claim 1, wherein the detection circuit is configured to set to the detection element status to the disturbed status in response to a change in either an inductance or a capacitance of the detection element.

9. The device of claim 1, wherein the detection element status is set to the disturbed status in response to a change in a distributed resistance of the detection element.

10. The device of claim 1, wherein the tamper detection device is coupled to a package and the package is at least one of a bottle, a box, a bag, a pharmaceutical, a single-use device, an electronic device, an entry device, a security device, a stamp, an envelope, an electronic seal, a gas meter, a water meter, an electrical meter, as a seal of trucks, or a suitcase.

11. The device of claim 1, wherein the detection element status is set to the disturbed status in response to at least one of a breach, a tear, a displacement, a repair, or an electrical variation that exceeds a predetermined tolerance in the detection element.

12. The device of claim 1, further comprising:
a plurality of detection elements, wherein the detection circuit is configured to report a number of detection elements having the disturbed status.

13. The device of claim 12, wherein the detection circuit is configured to rank the plurality of detection elements having the disturbed status in terms of importance.

14. The device of claim 1, wherein the detection circuit further comprises:
a comparator circuit configured to sample a voltage drop over the detection element during a defined time window and set the detection element to the disturbed status after the voltage drop is above or below the predetermined tolerance range.

15. A method for tamper detection, comprising:
powering a detection circuit with a near-field-communication (NFC) signal;

counting, with a detection element comprising a conductor on an opposite side from the detection circuit, a number of detection oscillator clock cycles;

comparing, with the detection element, the counted number of detection oscillator clock cycles to a number of reference oscillator clock cycles, wherein the detection oscillator has an inductance (L) in combination with a capacitance (C) embedded in the detection circuit;

setting, with the detection element, a status of a detection element to an undisturbed status after the counted number of detection oscillator clock cycles is within a predetermined tolerance range, wherein the predetermined tolerance range is defined between a low count threshold and a high count threshold;

setting, with the detection element, the status of the detection element to a disturbed status after the counted number of detection oscillator clock cycles is either above the high count threshold or below the low count threshold; and reporting the detection element status in response to a wireless query signal.

16. The method of claim 15, further comprising:
setting the detection element status to the disturbed status in response to a change in either an inductance or a capacitance of the detection element.

17. The method of claim 15, further comprising:
setting the detection element status to the disturbed status in response to a change in a delay characteristic of the detection element.

* * * * *